United States Patent

Chang

(10) Patent No.: US 10,826,528 B2
(45) Date of Patent: Nov. 3, 2020

(54) DECODING METHOD FOR LOW-DENSITY PARITY-CHECK CODE AND SYSTEM THEREOF

(71) Applicant: REALTEK SEMICONDUCTOR CORP., Hsinchu (TW)

(72) Inventor: Che-Chia Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/410,511

(22) Filed: May 13, 2019

(65) Prior Publication Data

US 2020/0136646 A1 Apr. 30, 2020

(30) Foreign Application Priority Data

Oct. 31, 2018 (TW) .............................. 107138636 A

(51) Int. Cl.
*H03M 13/11* (2006.01)
*G06F 13/28* (2006.01)
*H03M 13/00* (2006.01)

(52) U.S. Cl.
CPC ......... *H03M 13/1131* (2013.01); *G06F 13/28* (2013.01); *H03M 13/616* (2013.01)

(58) Field of Classification Search
CPC ................................................ H03M 13/1131
USPC .......................................... 714/776, 775, 774
See application file for complete search history.

(56) References Cited

U.S. PATENT DOCUMENTS

| 7,730,322 | B2 * | 6/2010 | Johnson | G06F 21/50 380/264 |
|---|---|---|---|---|
| 2007/0062723 | A1 * | 3/2007 | Kim | H05K 3/002 174/255 |
| 2010/0162075 | A1 | 6/2010 | Brannstrom et al. | |
| 2013/0262538 | A1 | 10/2013 | Wegener | |

* cited by examiner

*Primary Examiner* — Fritz Alphonse
(74) *Attorney, Agent, or Firm* — Li & Cai Intellectual Property (USA) Office

(57) ABSTRACT

A decoding method for low-density parity-check (LDPC) code is provided and is configured to decode a communication protocol, which is pending to be tested. The communication protocol includes a code word, and the code word includes a code rate. The decoding method includes: receiving the code word of the communication protocol, which is pending to be tested; determining a parity-check matrix according to the code rate of the code word and saving the parity-check matrix in a dynamic memory; moving the parity-check matrix from the dynamic memory to a first memory and saving the code word in a second memory; sequentially transmitting the code word from the second memory to a plurality of check node units to calculate according to the parity-check matrix in the first memory; transmitting the code word verified by the check node units back to the second memory.

20 Claims, 3 Drawing Sheets

DECODING METHOD FOR LOW-DENSITY PARITY-CHECK CODE AND SYSTEM THEREOF

CROSS-REFERENCE TO RELATED PATENT APPLICATION

This application claims the benefit of priority to Taiwan Patent Application No. 107138636, filed on Oct. 31, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a decoding method for low-density parity-check code and a system thereof, and more particularly to a decoding method for low-density parity-check code and a system thereof without using read-only memories.

BACKGROUND OF THE DISCLOSURE

Low-density parity-check (LDPC) code has been used in different communication protocols, and each of the communication protocols defines a parity-check matrix corresponding to different code rates. The communication protocol with the different code rate will include a different parity-check matrix.

FIG. 1 is a schematic view of a conventional decoder for LDPC code. As shown in FIG. 1, a conventional decoder 10 for LDPC code includes a plurality of read-only memories (ROMs) 102, a static random access memory (SRAM) 104, a plurality of check note units (CNUs) 106, a buffer 108 and a plurality of shifters 110. When the decoder 10 receives the code word of the communication protocol, which is pending to be tested, according to the code rate of the code word, the parity-check matrix saved in one of the ROMs 102 is determined to be read to perform decoding.

However, for the decoder requested to support LDPC codes for many communication protocols, the information of parity-check matrix for each of the code rates in each of the protocols has to be recorded within the ROMs in advance. A table shown below lists digital video broadcasting systems implementing the LDPC code, and each of the digital video broadcasting systems defines different code rates. Each of the code rates corresponds to a unique parity-check matrix and only one of the code rates is decoded each time. In other words, only one of the ROMs will be read, and the rest of the ROMs will be idled. For the decoders requested to support different kinds of the LDPC codes, the area occupied by the ROMs storing the LDPC codes is quite large. According to the table below, it is obvious to understand that it requires 76 ROMs to store the information of the parity-check matrixes if four protocols are needed to be supported at the same time.

| Standard | Frame length | Number of code rates |
| --- | --- | --- |
| DVB-T2 | NORMAL | 6 |
|  | SHORT | 7 |
| DVB-C2 | NORMAL | 5 |
|  | SHORT | 6 |
| DVB-S2 | NORMAL | 11 |
|  | SHORT | 10 |
| DVB-S2X | NORMAL | 21 |
|  | MEDIUM | 3 |
|  | SHORT | 7 |

Accordingly, when more and more parity-check matrixes are requested, more and more ROMs are needed. For the decoder for the LDPC codes supporting many kinds of communication protocols at the same time, the size of the area occupied by the ROMs storing the parity-check matrix is quite large, causing the issue that the size of the chip is too large. Therefore, how to reduce the number of the ROMs is a significant issue to be solved in decoding field.

SUMMARY OF THE DISCLOSURE

A decoding method for low-density parity-check (LDPC) code and a system thereof are provided in the present disclosure without using any read-only memories (ROMs).

In order to solve the aforementioned technical problem, an embodiment of the present disclosure provides a decoding method for LDPC code and the decoding method is used to verify a communication protocol, which is pending to be tested. The communication protocol includes a code word, and the code word includes a code rate. The decoding method includes steps: receiving the code word of the communication protocol; searching a parity-check matrix according to the code rate of the code word and saving the parity-check matrix in a dynamic memory; moving the parity-check matrix from the dynamic memory to a first memory, and saving the code word in a second memory; sequentially transmitting the code word from the second memory to a plurality of check node units according to the parity-check matrix saved in the first memory and verifying the code word in the check node units; and transmitting the code word verified in the check node units back to the second memory.

In order to solve the aforementioned technical problem, another embodiment of the present disclosure provides a decoding method for LDPC code and the decoding method is used to verify a communication protocol, which is pending to be tested. The communication protocol includes a code word, and the code word includes a code rate. The decoding method includes steps: saving a plurality of parity-check matrixes in a dynamic memory; receiving the code word of the communication protocol; searching one of the parity-check matrixes according to the code rate of the code word; moving one of the parity-check matrixes from the dynamic memory to a first memory, and saving the code word in a second memory; sequentially transmitting the code word from the second memory to a plurality of check node units according to one of the parity-check matrixes saved in the first memory and verifying the code word in the check node units; and transmitting the code word verified in the check node units back to the second memory.

In order to solve the aforementioned technical problem, another embodiment of the present disclosure provides a decoding system for LDPC code and the decoding system is used to verify a communication protocol, which is pending to be tested. The communication protocol has a code word and the code word has a code rate. The decoding system includes a dynamic memory, a first memory, a second memory, a plurality of check node units, and a buffer. The dynamic memory is configured to save at least one parity-check matrix. The first memory is electrically connected to the dynamic memory and configured to save the at least one parity-check matrix transmitted from the dynamic memory. The second memory is electrically connected to the first memory and configured to save data of the code word. The check node units are connected to the second memory and configured to receive and calculate the code word respectively. The buffer is electrically connected to the check node units and configured to save the code word verified by the check note units.

The decoding method for LDPC code provided in the present disclosure is to implement only one dynamic memory without using a large number of read-only memories (ROMs), and the decoding purpose can also be achieved to save the usage area of the chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
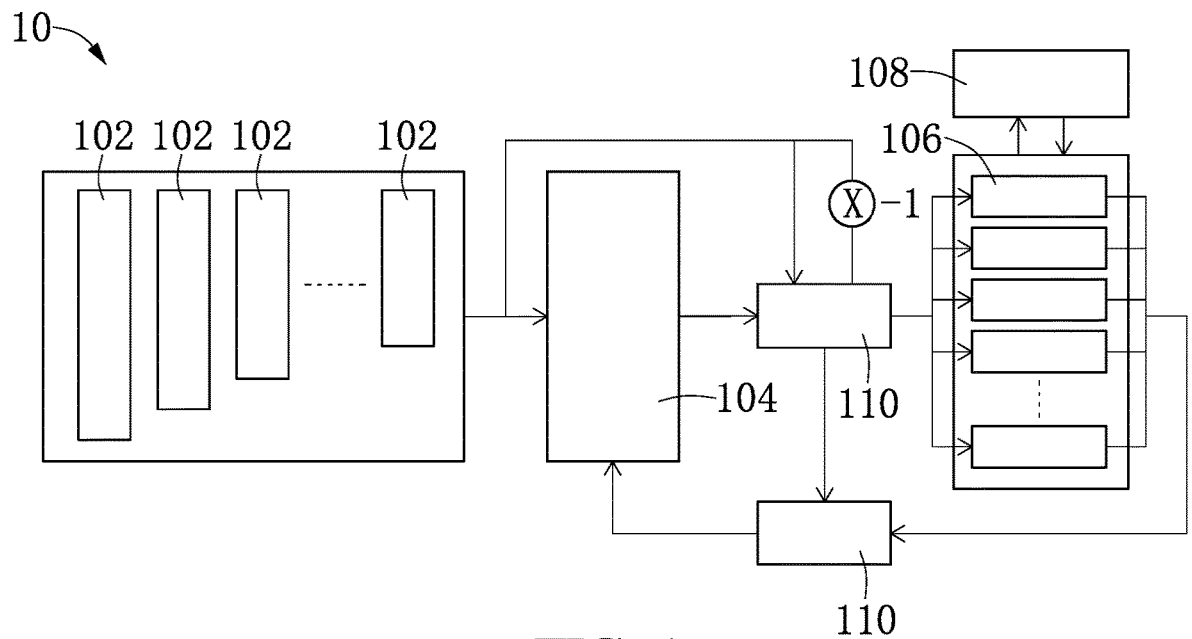
FIG. 1 is a schematic view of a conventional decoder for LDPC code.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Low-Density Parity-Check (LDPC) code is a kind of linear block code. The conventional linear block code is to multiply original transmitting data (k bits) by Generate matrix (G matrix) and plus additional data (m bits) at a transmitting end, and those data (n bits=m+k) are transmitted to a receiving end. When the receiving end receives those data, those data is verified and modified through a parity-check matrix so as to recover those data to be the original data.

The present disclosure is related to a decoding method for LDPC code and a system thereof, so that the receiving data is encoded data, and the receiving data is recovered by the decoding method for LDPC code and the system thereof in the present disclosure, and the recovered data is the same as the original data.

[An Embodiment of the Decoding System for LDPC Code]

Figure 2:
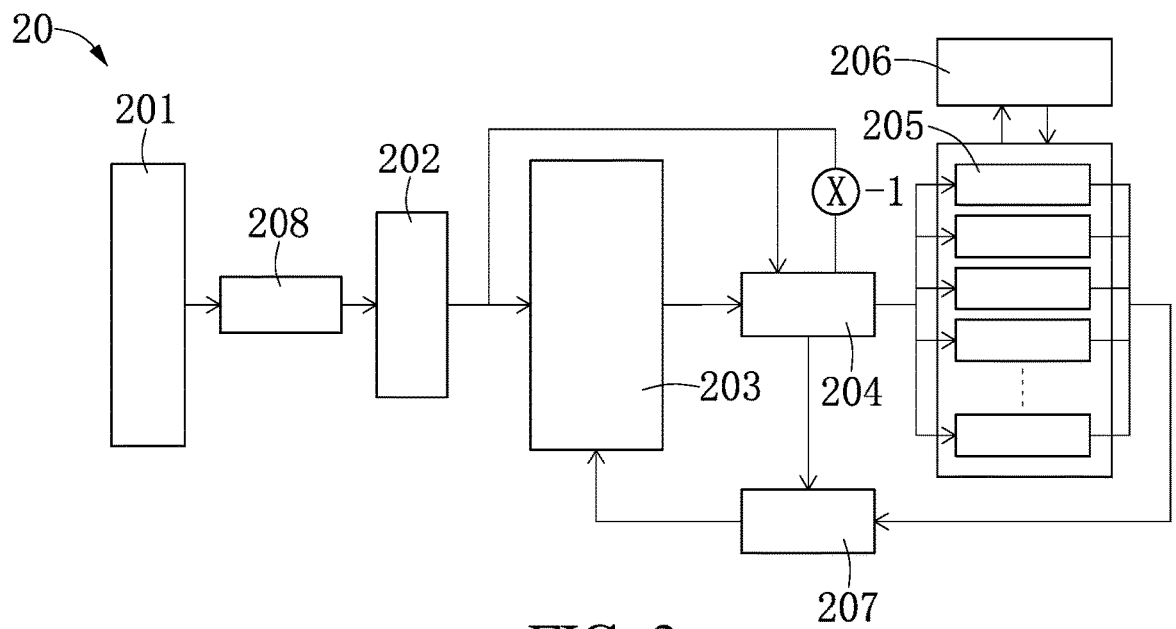
FIG. 2 is a block diagram of a decoding system for low density parity-check (LDPC) code in the present disclosure.

FIG. 2 is a block diagram of a decoding system for LDPC code in the present disclosure. As shown in FIG. 2, a decoding system 20 for LDPC code provided in an embodiment of the present disclosure includes a dynamic memory 201, a first memory 202, a second memory 203, a first shifter 204, a plurality of check node units (CNUs) 205, a buffer 206 and a second shifter 207. The dynamic memory 201 is preferred to be a dynamic random access memory (DRAM), such as a double data rate DRAM (DDR DRAM), but the present disclosure is not limited thereto. The first memory 202, the second memory 203 and the buffer 206 are preferred to be static random access memory (SRAM), but the present disclosure is not limited thereto.

The dynamic memory 201 is configured to save at least one parity-check matrix. The first memory 202 is electrically connected to the dynamic memory 201 and configured to save the at least one parity-check matrix transmitted from the dynamic memory 201. The second memory 203 is electrically connected to the first memory 202 and configured to save the code word. The code word is the data from the communication protocol, which is pending to be tested, and received by the decoding system 20 for the LDPC code. The code word includes a code rate and the corresponding parity-check matrix can be found according to the code rate. For example, the corresponding parity-check matrix can be found according to the code rate via a look-up table, and the parity-check matrix is saved in the dynamic memory 201, but the present disclosure is not limited thereto. In addition, it should be noted that the code word saved in the second memory and the parity-check matrix moved from the dynamic memory 201 to the first memory 202 are occurred at the same time. In other words, when the code word is saved in the second memory 203, the parity-check matrix is moved from the dynamic memory 201 to the first memory 202. Moreover, in a preferred embodiment of the present disclosure, the decoding system 20 further includes a direct memory access controller (DMA controller) 208, and the parity-check matrix is moved from the dynamic memory 201 to the first memory 202 through the DMA controller 208.

The second memory 203 is electrically connected to the first shifter 204, and the code word in the second memory 203 is read according to the parity-check matrix in the first memory 202, and the code word is sequentially transmitted through the first shifter 204. The CNUs 205 are electrically connected to the first shifter 204 respectively. Specifically, the CNUs 205 are electrically connected to the second memory 203 through the first shifter 204, and each bit in the code word is sequentially transmitted to each of the CNUs 205 through the first shifter 204 so as to be verified. The buffer 206 is electrically connected to the CNUs 205 and configured to save the data of the code word verified by the CNUs 205. The second shifter 207 is electrically connected to the CNUs 205 and the second memory 203. The verified code word is saved in the buffer 206 and then the verified code word is recovered to be the original code word by the CNUs 205 through the second shifter 207. The verified code word is saved in the second memory 203 so as to complete the data decoding and parity-checking.

In addition, in another embodiment of the present disclosure, all of the parity-check matrixes can be saved in the dynamic memory 201, and the corresponding parity-check matrix is found in the dynamic memory according to the code rate for the code word of the communication protocol, which is pending to be tested. The parity-check matrix is transmitted to the first memory 203. That is, in the present disclosure, as only one dynamic memory is used, the purpose of without implementing any read-only memories (ROMs) can be achieved. It is well known for the person with ordinary skill in the art to search the corresponding parity-check matrix in the dynamic memory according to the code rate, and the detail thereof is omitted thereto.

By the decoding system 20 for LDPC code in the present disclosure, when the code word for the communication protocol, which is pending to be tested, is available, the corresponding parity-check matrix is saved from the external memory (e.g., flash memory) or the storage medium to the dynamic memory 201. Therefore, as the requested parity-check matrix is saved in the dynamic memory 201, it is not necessary to use a large number of the ROMs to store a plurality of parity-check matrixes. That is, only one dynamic memory can replace a large number of ROMs, so that the decoding purpose can be achieved.

[A First Embodiment for Decoding Method for LDPC Code]

Figure 3:
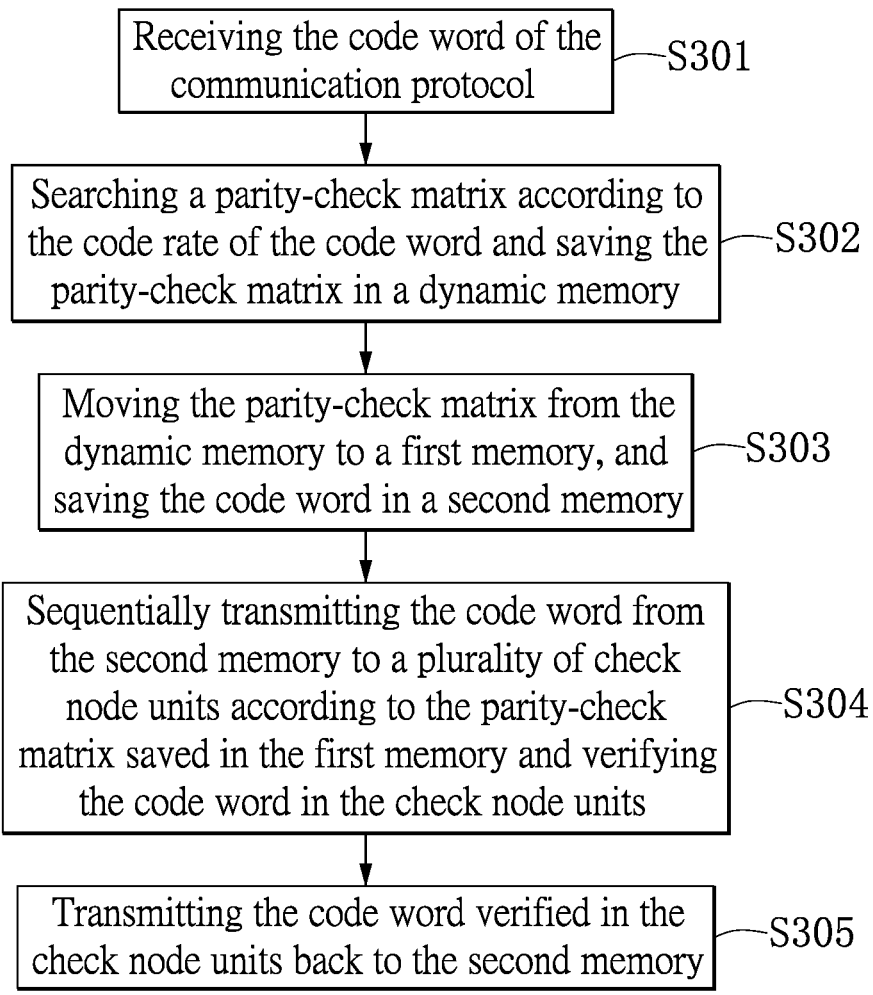
FIG. 3 is a flow chart of a decoding method for LDPC code in a first embodiment of the present disclosure.

FIG. 3 is a flow chart of a decoding method for LDPC code in a first embodiment of the present disclosure. As shown in FIG. 3, the decoding method for LDPC code in the present disclosure is performed by implementing the aforementioned decoding system for LDPC code, and is configured to verify a communication protocol, which is pending to be tested. The communication protocol, which is pending to be tested, includes a code word and the code word includes a code rate. The decoding method includes the following steps.

In step S301, the code word for the communication protocol, which is pending to be tested, is received. When the communication protocol is requested to be tested, the decoding system for LDPC code will receive the code word for the communication protocol, which is pending to be tested, and the code word is the data of the communication protocol, which is pending to be tested. Then, in step S302, a parity-check matrix corresponding to a code rate is found according to the code rate of the code word, and the parity-check matrix is saved in a dynamic memory. The code word in each of the communication protocols includes a code rate and the corresponding parity-check matrix can be found according to the code rate. In the first embodiment of the present disclosure, the corresponding parity-check matrix can be saved from the external storage medium (such as flash memory, and so on) to the dynamic memory according to the code rate via a look-up table, but the present disclosure is not limited thereto.

In step S303, the parity-check matrix is moved from the dynamic memory to a first memory and the code word is saved in a second memory. In the first embodiment of the present disclosure, by using a direct memory access controller, the parity-check matrix is moved from the dynamic memory to the first memory. The parity-check matrix is saved in the internal first memory from an external dynamic memory and the code word is saved in the second memory at the same time. The first memory and the second memory are preferred to be static random access memory (SRAM). In step S304, according to the parity-check matrix in the first memory, the code word in the second memory is sequentially transmitted to a plurality of check note units (CNUs) to perform calculation. During the decoding procedure, the data of the code is requested to be checked and modified according to the parity-check matrix. Therefore, according to the parity-check matrix, the code word in the second memory is sequentially read through a first shifter. For example, each bit in the code word is moved each time, and the code word is transmitted to the parity-check units to be verified.

Then, in step S305, the verified code word at the CNUs is transmitted back to the second memory. Specifically, the verified code word at the CNUs will be transmitted to a buffer to be temporarily saved, and the verified code word will be transmitted back to the second memory through the CNUs and a second shifter after all of the CNUs complete calculation to finish the work of decoding and checking.

Through the decoding method for the LDPC code in the present disclosure, when the code word of the communication protocol, which is pending to be tested, is known, according to the code rate of the code word, the corresponding parity-check matrix is moved from the external memory or a storage medium to the dynamic memory. Therefore, as the requested parity-check matrix is saved in the dynamic memory, it is not necessary to use a large number of the ROMs to store a plurality of the parity-check matrixes. That is, only one dynamic memory is used, the purpose of without implementing any ROMs can be achieved.

[A Second Embodiment of Decoding Method for LDPC Code]

Figure 4:
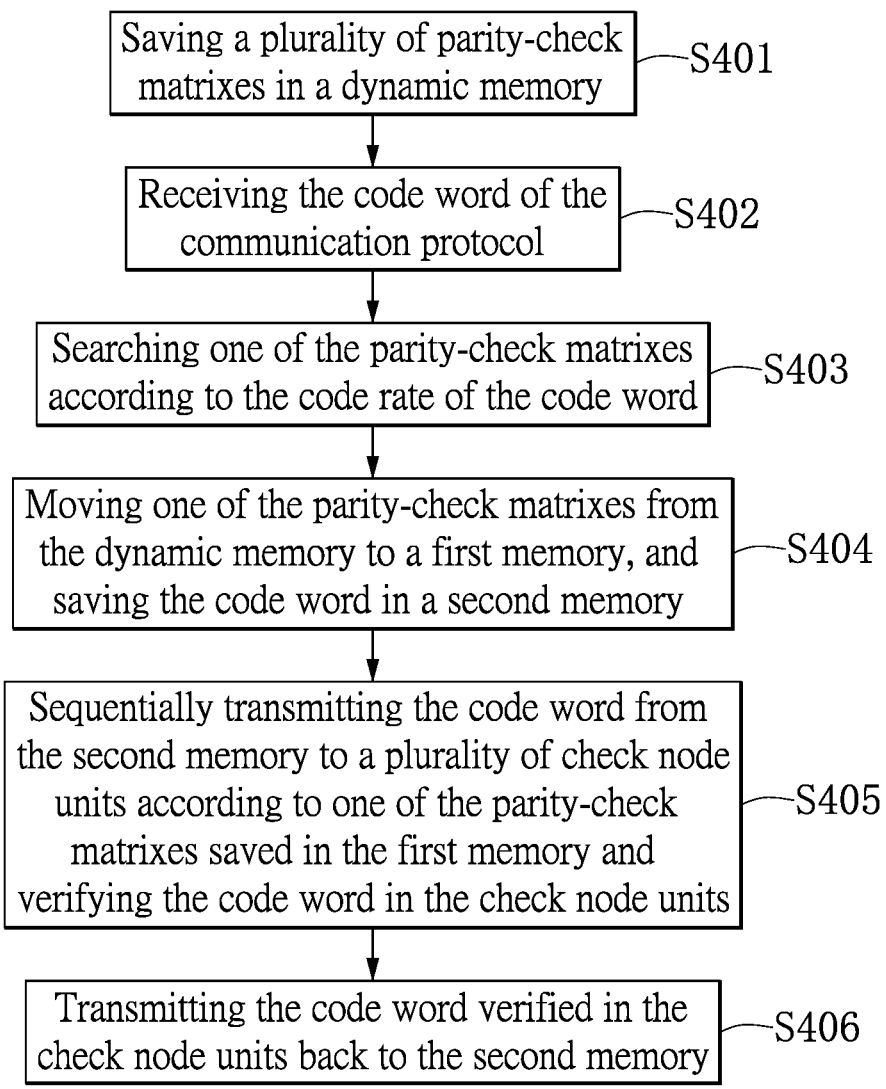
FIG. 4 is a flow chart of the decoding method for the LDPC code in a second embodiment the present disclosure.

FIG. 4 is a flow chart of the decoding method for the LDPC code in a second embodiment of the present disclosure. As shown in FIG. 4, the decoding method for the LDPC code in the second embodiment of the present disclosure is also performed by implementing the aforementioned decoding system for the LDPC. The decoding method includes the following steps.

In step S401, a plurality of parity-check matrixes are saved in a dynamic memory. When a code word of a communication protocol is requested to be tested, the parity-check matrixes are from the external memory (e.g., a flash memory) or the storage medium (i.e., a hard drive) to be saved in a dynamic memory. Then, in step S402, a code word of a communication protocol, which is pending to be tested, is received. When a communication protocol is requested to be tested, the code word is the data for the test in the communication protocol. Then, in step S403, according to a code rate of the code word, one of the parity-check matrixes corresponding to the code rate is found in the dynamic memory. The code word in each of the communication protocols includes a code rate, the corresponding parity-check matrix can be found according to the code rate. In the preferred embodiment of the present disclosure, via a look-up table, according to the code rate, the corresponding parity-check matrix is from an external memory (e.g., flash memory) to be saved in the dynamic memory, but the present disclosure is not limited thereto.

In step S404, the parity-check matrix is moved from the dynamic memory to a first memory and the code word is saved in a second memory. In the preferred embodiment of the present disclosure, by a direct memory access controller, the parity-check matrix is moved from the dynamic memory to the first memory. The parity-check matrix is moved from the external dynamic memory to the internal first memory and the code word is saved in the second memory at the same time. The first memory and the second memory are preferred to be SRAM. In step S405, according to one of the parity-check matrixes saved in the first memory, the code word in the second memory is sequentially moved to a plurality of CNUs to be verified. During the decoding procedure, the data of the code word is requested to be checked and modified according to the parity-check matrix. Therefore, according to the parity-check matrix, the code word in the second memory is sequentially read through the first shifter. For example, each time a bit of the word is moved and transmitted to the CNUs to be verified.

Then, in step S406, the update data of the code word verified through the CNUs is transmitted back to the second memory. Specifically, the code word verified through the CNUs is firstly transmitted and saved in a buffer, and the verified code word is transmitted from the buffer through the CNUs and the second shifter to the second memory so as to finish the work of decoding and checking.

Through the decoding method for the LDPC code in the present disclosure, when the code word for the communication protocol, which is pending to be tested, is known, the corresponding parity-check matrix is from the external memory or the storage medium to be saved in the dynamic memory. Therefore, as the requested parity-check matrix is saved in the dynamic memory, it is not necessary to use a large number of the ROMs to store a plurality of the parity-check matrixes. That is, only one dynamic memory is used, the purpose of without implementing any ROMs can be achieved.

One of the advantages in the present disclosure is only one dynamic memory needed in the decoding method for the LDPC code and system thereof in the present disclosure without implementing a large number of the ROMs, and the decoding purpose can also be achieved to save the usage area of the chip.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An decoding method for low-density parity-check code used to verify a communication protocol, which is pending to be tested, and the communication protocol having a code word and the code word having a code rate, the decoding method comprising:

receiving the code word of the communication protocol;
searching a parity-check matrix according to the code rate of the code word and saving the parity-check matrix in a dynamic memory;
moving the parity-check matrix from the dynamic memory to a first memory, and saving the code word in a second memory;
sequentially transmitting the code word from the second memory to a plurality of check node units according to the parity-check matrix saved in the first memory and verifying the code word in the check node units; and
transmitting the code word verified in the check node units back to the second memory.

2. The decoding method according to claim 1, wherein in the step of searching the parity-check matrix according to the code rate of the code word, the corresponding parity-check matrix is saved from an external storage medium to the dynamic memory according to the code rate via a look-up table.

3. The decoding method according to claim 1, wherein in the step of moving the parity-check matrix from the dynamic memory to the first memory, the parity-check matrix is moved from the dynamic memory to the first memory by a direct memory access controller.

4. The decoding method according to claim 1, wherein in the step of moving the parity-check matrix from the dynamic memory to the first memory and saving the code word in the second memory, the parity-check matrix is saved from the dynamic memory to the first memory and the code word in the second memory is saved at the same time.

5. The decoding method according to claim 1, wherein in the step of sequentially transmitting the code word from the second memory to a plurality of the check node units according to the parity-check matrix saved in the first memory and verifying the code word in the check node units, the code word from the second memory is sequentially transmitted to the check node units through a first shifter to be verified.

6. The decoding method according to claim 5, wherein in the step of transmitting the code word verified in the check node units back to the second memory, the code word verified by the check node units will be transmitted and saved in a buffer and the verified code word is transmitted from the buffer to the second memory through the check node units and a second shifter.

7. An decoding method for low-density parity-check code used to verify a communication protocol, which is pending to be tested, and performed by a decoding system, and the communication protocol having a code word and the code word having a code rate and the decoding system including a dynamic memory, a first memory, a second memory, a plurality of check node units and a buffer, the decoding method comprising:

saving a plurality of parity-check matrixes in the dynamic memory;
receiving the code word of the communication protocol;
searching one of the parity-check matrixes according to the code rate of the code word;
moving one of the parity-check matrixes from the dynamic memory to the first memory, and saving the code word in the second memory;
sequentially transmitting the code word from the second memory to the check node units according to one of the parity-check matrixes saved in the first memory and verifying the code word in the check node units; and
transmitting the code word verified in the check node units back to the second memory.

8. The decoding method according to claim 7, wherein in the step of searching the parity-check matrix according to the code rate of the code word, the corresponding parity-check matrix in the dynamic memory is saved from an external storage medium according to the code rate via a look-up table manner.

9. The decoding method according to claim 7, wherein in the step of moving the parity-check matrix from the dynamic memory to the first memory, a direct memory access controller is implemented to move the parity-check matrix from the dynamic memory to the first memory.

10. The decoding method according to claim 7, wherein in the step of moving the parity-check matrix from the dynamic memory to the first memory and saving the code word in the second memory, the parity-check matrix is saved from the dynamic memory to the first memory and save the code word in the second memory at the same time.

11. The decoding method according to claim 7, wherein in the step of sequentially transmitting the code word from the second memory to a plurality of the check node units according to the parity-check matrix saved in the first memory and verifying the code word in the check node units, the code word is sequentially transmitted from the second memory to the check node units through a first shifter and verifying the code word in the check node units.

12. The decoding method according to claim 11, wherein in the step of transmitting the code word verified in the check node units back to the second memory, the code word is verified by the check node units will be transmitted and saved in the buffer and the verified code word is transmitted from the buffer to the second memory through the check node units and a second shifter.

13. A decoding system for low-density parity-check code used to verify a communication protocol, which is pending to be tested, and the communication protocol having a code word and the code word having a code rate, and the decoding system comprising:
a dynamic memory configured to save at least one parity-check matrix;
a first memory electrically connected to the dynamic memory and configured to save the at least one parity-check matrix transmitted from the dynamic memory;
a second memory electrically connected to the first memory and configured to save data of the code word;
a plurality of check node units connected to the second memory and configured to receive and calculate the code word respectively; and
a buffer electrically connected to the check node units and configured to save the code word verified by the check note units.

14. The decoding system of claim 13, further comprising:
a first shifter electrically connected to the second memory and the check note units, and configured to sequentially read and transmit the code word to each of the check note units; and
a second shifter electrically connected to the second memory and the check note units, and configured to sequentially transmit the verified code word back to the second memory.

15. The decoding system of claim 13, further comprising a direct memory access controller configured to move the at least one parity-check matrix from the dynamic memory to the first memory.

16. The decoding system of claim 13, wherein in the decoding system, the at least one parity-check matrix is saved in the dynamic memory according to the code rate of the code word.

17. The decoding system of claim 13, wherein in the decoding system, the at least one parity-check matrix is saved from a storage medium to the dynamic memory.

18. The decoding system of claim 13, wherein the communication protocols are digital video broadcasting communication protocols.

19. The decoding system of claim 13, wherein the dynamic memory is dynamic random access memory (DRAM).

20. The decoding system of claim 13, wherein the first memory and the second memory are static random access memories (SRAM).

* * * * *